United States Patent [19]

Robinson

[11] Patent Number: 4,601,032

[45] Date of Patent: Jul. 15, 1986

[54] TEST-GENERATION SYSTEM FOR DIGITAL CIRCUITS

[75] Inventor: Gordon D. Robinson, Fareham, United Kingdom

[73] Assignee: Cirrus Computers Ltd., Fareham, United Kingdom

[21] Appl. No.: 566,876

[22] Filed: Dec. 29, 1983

[30] Foreign Application Priority Data

Oct. 17, 1983 [GB] United Kingdom ............... 8327753

[51] Int. Cl.[4] ........................................... G06F 11/04
[52] U.S. Cl. ........................................ 371/23; 371/25
[58] Field of Search .................... 324/73 R, 73 AT; 371/27, 23, 25, 26, 24

[56] References Cited

U.S. PATENT DOCUMENTS

| | | | |
|---|---|---|---|
| 4,204,633 | 5/1980 | Goel | 371/23 |
| 4,410,987 | 10/1983 | Ptosinski et al. | 371/25 |
| 4,433,412 | 2/1984 | Best et al. | 371/25 |
| 4,433,413 | 2/1984 | Fasang | 371/25 |
| 4,435,806 | 3/1984 | Segers et al. | 371/25 |
| 4,503,537 | 3/1985 | McAnney | 371/25 |
| 4,510,572 | 4/1985 | Reece | 371/25 |
| 4,519,078 | 5/1985 | Komonytsky | 371/25 |

*Primary Examiner*—Michael R. Fleming
*Attorney, Agent, or Firm*—Cesari and McKenna

[57] ABSTRACT

In a system for generating tests for digital circuits, a fault simulator (16) simulates a fault-free version of the circuit and all expected faulty versions of it concurrently, basing its operation on information contained in a data base (12) that contains information about the structure and possible defects of the circuits to be tested. A waveform system (14) carries high-level information regarding the general structure of the test waveform that ultimately is to be derived, such as clock signals, timing constraints, and other restrictions that the designer of the circuit under test has placed on the signals to be applied to it. At each point in this outline waveform at which the system needs to insert input signals, a test generator (18) is called by the waveform system (14) to derive a test vector based on information concerning the layout of the circuit, its possible defects, and its current state, the current state having been communicated to the data base (12) by the fault simulator (16), which determines the states that result from application of a waveform received from the waveform system (14). Even for non-scan-type circuits under test, the test generator derives only one test vector at a time, without searching through sequences of test vectors to find which sequences of test vectors might cause propagation of faults to the output ports of the circuit under test. It nonetheless efficiently derives test waveforms because it chooses among the fault effects of all faulty versions of the circuit concurrently for those effects that are likely candidates for propagation.

2 Claims, 9 Drawing Figures

TEST-GENERATION SYSTEM FOR DIGITAL CIRCUITS

BACKGROUND OF THE INVENTION

The present invention is directed to the generation of tests for complex digital circuitry. It has particular application to tests for non-scan-type circuits.

As the complexity of circuits provided on a single semiconductor chip has increased, the difficulty of determining whether a particular chip is functional has increased geometrically. As the complexity increases, the number of states of the chip increases rapidly. For many chips, the time required to test every state for every possible input to the chip, even if a change of inputs could be made every picosecond, would be greater than the 18 billion years since the Big Bang.

For most circuits that are actually manufactured, however, it is possible to test for all likely defects by means of tests that can be performed in a reasonable amount of time, but the design of such tests has itself proved quite complex. Because of the complexity of such tests, it has been necessary to design them by machine; manual generation of the tests has proved impractical for the more complex circuits. It is to methods for designing such tests that the present invention is directed.

At this point, it is beneficial to set forth the nomenclature that will be employed throughout the rest of the specification; nomenclature in this area is often confusing because identical terms often have different meanings at different times.

In some very simple digital circuits, such as NAND gates, the output of the circuit is determined entirely by its input; the circuit has no memory. However, if the circuit is given some feedback, it can be made into a memory element, such as a flip-flop. In a D-type flip-flop, the output, which represents its current state, is determined not by the current input but rather by the input at the most recent clock time. In a J-K-type flip-flop, the output is determined not only by the input at the most recent clock time but also by the previous state of the flip-flop.

In both of these types of flip-flops, and in flip-flops generally, the state of the individual flip-flop can have one of two values. If the flip-flop is part of a larger circuit, the value of its individual state can be considered a state variable comprising one of the components of a vector representing the state of the entire circuit. In order to differentiate between the state of the entire circuit and the sttes of individual components, the term *state* will hereinafter be used to indicate the value of the vector consisting of all the *state variables* representing the components making up the circuit.

The terms *input* and *output* will be used to describe signals on individual physical terminals or ports, e.g., input pins on the chip to be tested, and *output* will be used to represent signals on individual output ports. The term *input vector* will be used to describe the ensemble of input signals on the input ports, while the term *output vector* will be used to describe the ensemble of signals on the output ports.

A *fault* or *fault origin* is the physical defect in a faulty circuit. A *fault effect* is a difference caused by a fault between a signal in a faulty version of a circuit and the signal at the same position in the fault-free version of the same circuit after any particular sequence of inputs to the circuit.

In order to determine that a fault is present in a circuit, a sequence of input vectors must be selected that will cause the fault to result in a difference between the outputs of the faulty version and the outputs of a fault-free version. For example, if a defect in a faulty version is a signal line that is stuck at a zero value, and if that signal line is an input to an AND gate whose output is a circuit output, then it is necessary, in order to detect the fault, to provide signals that would cause ones to appear at both input ports of the AND gate if the circuit were not faulty. Any other set of signals would result in an output of the AND gate in the faulty version that is the same as the AND-gate output in the fault-free version, so there would be no basis from which it could be inferred that the faulty version is faulty.

A fault origin can be so deeply imbedded in a circuit that it is impossible for the fault effects resulting from a fault origin to propagate to an output without the application of a very long sequence of inputs. That is, although the fault origin can often be made to cause a difference between the state of the faulty version and that of the fault-free version by application of a single input vector, the state variable or variables in which the two versions differ may not be immediately observable in the circuit output.

In the past, this has caused some difficulty in designing tests for circuits of high complexity. Many such circuits have therefore been designed to include additional circuitry that allows the state components of the circuit to be connected as a shift register so that the state variables can easily be read directly. The same circuitry allows the state of the circuit to be set directly. For instance, one pin in a multi-pin circuit could indicate whether the circuit is to operate in the normal manner or as a shift register, another pin could receive the clock signal, a third pin could receive data to be written into the shift register, and a fourth pin could be a shift-register output pin, whose signal level at successive clock times would represent the contents of individual state components of the circuit viewed as a finite-state machine.

This so-called scan type of organization is beneficial because it allows tests to be designed as readily as if there were no stored state. Test-generation routines exist for finding an initial state and an input vector that will cause effects from particular faults to be propagated into a state of the machine. It is then a simple matter to read out the machine's state and observe whether there are any differences between that state and the state of a fault-free machine. The routine simply selects from among the several possible faults in the machine, employs a standard rule-of-thumb type of routine for finding a likely initial state and input vector, and then runs the chosen state and input vector through a simulator to determine that a fault effect indeed shows up in one or more of the state components of the machine.

Although this type of circuit design results in enhanced testability, it also places unwanted constraints on the circuit designer and adds complexity to the design. For instance, a memory cell in an MOS circuit might inherently require only a transmission gate followed by an inverter in order to provide the data-storage function. In order to enable the state of that memory cell to permit its state to be read as the contents of a stage in a shift register, however, the same memory cell might require a dozen gates. Thus, although the provision of scan-type circuits permits tests to be generated readily in many cases, such circuits are often needlessly complex.

If the scan-type design philosophy is not followed, on the other hand, the test-generation process can be quite difficult since it is not easy to observe the state of the device under test directly, and the determination of whether the device is faulty must be made by observing the outputs of the system only. The typical methods for developing tests for such systems involve selecting a fault origin to be detected and then employing a routine for "guessing," based on the circuit layout, at a likely sequence of input vectors that will cause effects of the fault to be propagated to the output ports of the device under test. Once a successful sequence of input vectors is found for a given fault origin, another fault origin is chosen, and the steps are repeated. This process continues until a total sequence is found that is a test for all of the faults.

A problem with this type of test-generation method is that it requires searches through many long sequences of input vectors. Since the number of possible sequences increases exponentially with the number of vectors in a sequence, such a process can be very time-consuming.

An object of the present invention is to generate tests for digital circuits without requiring that they be scan-type circuits and without using the long search routines that have been needed in the past to test circuits that are not of the scan type.

SUMMARY OF THE INVENTION

In contrast to previous systems for generating tests of non-scan-type circuits, the method of the present invention does not, in determining the makeup of an input vector to be applied at a given time, search among the possible sequences of input vectors that can propagate the effects of a single defect to the output of the circuit. Instead, the method of the present invention only considers the probable effects of the input vector under consideration individually; it does not consider what its effects will be when combined with possible subsequent input vectors. An objective of the vector to be determined is to propagate fault effects to an output port. Failing that objective, the present method attempts to propagate fault effects to another state component within the circuit even though the device under test cannot have its state read directly. Despite this one-vector-at-a-time approach, the apparatus of the present invention is usually quite efficient because it searches among the effects of all expected defects for good candidates for propagation; it does not concentrate on only one.

Generation of each input vector is determined entirely by knowledge of the layout of the circuit and of its current state. Subsequent input vectors are determined in the same manner, irrespective of the fault or faults to which the previous input vector was directed and regardless of whether that fault or faults were successfully propagated to an output by application of that previous input vector. Thus, in contrast to previous methods for generating tests for non-scan-type circuits, the generation of an individual input vector is determined "opportunistically" in that it is based only upon what can be accomplished individually by the vector being determined, not upon what can be accomplished by that vector as part of an extended sequence for propagating a particular fault or fault effect. This avoids long sequential searches, allows adaptation of existing methods that were previously employed in generating tests for scan-type circuits, and in most cases is very efficient as compared with previous test-generation systems for non-scan-type circuits.

BRIEF DESCRIPTION OF THE DRAWINGS

These and further features and advantages of the present invention are described in connection with the accompanying, drawings, in which.

DETAILED DESCRIPTION OF THE PREFERRED EMBODIMENT

Overview

Figure 1:
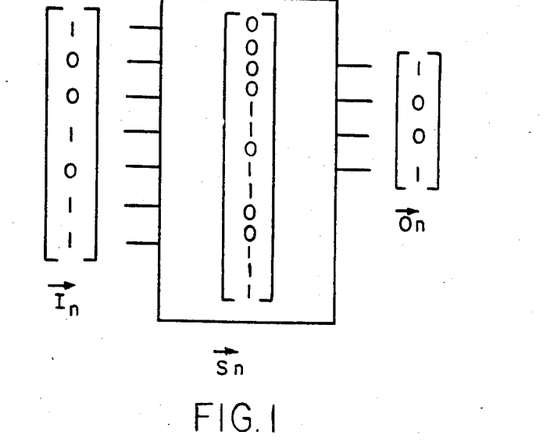
FIG. 1 is a diagram depicting the relationship between the input, output, and state vectors of a device to be tested by the system of the present invention.

The present invention is a method and apparatus for generating a test to be used on a digital circuit. The device for which a test is to be generated, being a digital circuit, is a finite-state machine. That is, it may be depicted by a diagram such as that in FIG. 1, which includes an input vector $I_n$, an output vector $O_n$, and a state vector $S_n$. In a finite-state machine, the current output is determined entirely by the current state and input vectors. This is depicted in FIG. 1.

Figure 2:
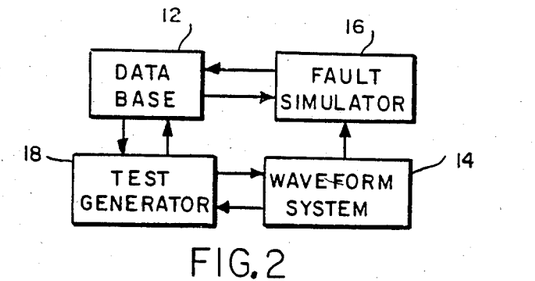
FIG. 2 is a block diagram of the manner in which the elements of the present invention relate to each other.

FIG. 2 illustrates the general scheme employed by the present invention. The blocks in that diagram represent the functional parts of an apparatus for carrying out the method of the present invention, and each can be embodied in digital circuits comprising appropriate arrays of logic elements. I consider it preferable, however, to include them all in a single digital computer.

A data base 12 includes general information about the circuit to be simulated and about the associated faulty versions of the circuit that will be simulated concurrently. This information includes the connections, possible faults, and, during simulation, the current state and fault effects. The portion of the system that is employed to produce input vectors is called, in accordance with common test-generation terminology, a waveform system 14. The waveform system 14 indicates the values of the input vectors and the times at which they are applied. In many simulation systems, the waveform system 14 also provides expected output vectors to test whether a system that is to be simulated performs as expected. This feature will not be considered for present purposes; it will be assumed that the design of the device under test has been completed so that the output vector in the fault-free circuit is as intended.

In accordance with the present invention, the waveform system 14 starts out the test-generation process with an "outline waveform"; it only has information concerning certain constraints to be placed on the test signals, such as the clock times, the values of the clock signals, and the times at which the input vectors can be changed. It may also include an initialization sequence supplied by the user that will place the circuit under test in a known initial state or one in which the values of many or most of the state variables are known. At the beginning of test generation, it typically does not have information on the values of most of the inputs to be applied, although it may include information about certain constraints that can beneficially be applied to the input vectors so that they will be restricted to those for which the device to be simulated was designed. The waveform may also include constraints regarding the hardware of the test system on which the test to be generated will be run.

The inputs that the waveform system 14 generates are applied to a fault simulator 16. This simulator may advantageously be of the type described in the paper delivered by P. R. Moorby at the 1983 I.C.C.A.D. Conference in Santa Clara, Calif., and entitled "Fault Simulator Using Parallel Value Lists" in the proceedings of that conference. The fault simulator uses the information in the data base 12 as well as the inputs from the waveform system 14 to determine the outputs that will result. It also determines the subsequent state of the simulated device under test and thereby updates the data base 12.

Finally, the system employs a test generator 18. The test generator 18 is called from time to time by the waveform system 14 to determine the values of the next input vector. In determining the next input vector, the test generator 18 uses information from the data base 12 regarding the state of the simulated versions of the circuit and their layouts. At different stages in the test generation, the test generator may use a variety of strategies under user direction, but the system of the present invention is distinguished by an "opportunistic" strategy, which will be described after an outline of the operation of the system.

Test generation begins with application by the waveform system 14 of an outline set of inputs to the fault simulator 16. The fault simulator performs the simulation by reference to a data base 12, which carries the initial state of the circuit under test. This state may be the initialization state if the circuit has such a readily settable state. In the alternative, the state may be partially defined, having definite values of certain state variables but leaving other state variables undetermined. In the latter case, the simulation would be carried out with the simulator storing as undetermined the signals and state variables whose values depend on the undetermined state variables.

At some point, the waveform system reaches a location in its sequence that requires an input vector to be computed by the test generator 18. It thus calls the test generator 18, which examines the current states of the simulated fault-free and faulty versions of the circuit, considering the several simulated versions concurrently in a manner that will be described below. The test generator chooses a circuit location in which at least one of the versions currently has a fault or fault effect. It picks values of input-vector components that will cause *propagation* of that fault or fault effect, i.e., that will cause that fault or fault effect to cause a fault effect in an output or a state variable. In doing so, it typically leaves some input-vector components unassigned. If unassigned input-vector components are left, it considers other faults and fault effects and attempts to propagate them by assigning values to other input-vector components. This process continues until a complete or nearly complete vector has been assembled. The test generator then transfers the assembled input vector to the waveform system, which stores it as part of its test program and also applies it to the fault simulator. The fault simulator determines the result of the test and updates the data base.

In updating the data base, the fault simulator notes which of faulty versions have faults whose effects have propagated to the output; that is, it notes which of the faulty versions being simulated has an output that differs from that of the fault-free version. For these faulty versions, simulation terminates because the test at that point is already adequate for them. Test generation only needs to continue for the faults that would not be detected by the portion of the test that has so far been generated.

The waveform system then proceeds with execution of the outline program until it reaches another point that requires an input vector to be determined by the test generator. The test generator operates as before, this time employing the data base as modified by the simulator in response to the previous input vector from the test generator and to other inputs generated by the waveform system in accordance with its outline waveform. The test generator transfers the new input vector to the waveform system, which stores it along with previous input vectors as part of the test waveform, and the process continues on in this manner either until all of the faults have been detected and thus dropped by the simulator or until the user interrupts the test generator to change the mode of test generation. In either case, the waveform that has been produced when all faults have been detected is applied to the actual circuits to be tested, and their resultant outputs are observed. Those whose outputs differ from the fault-free output are concluded to be faulty.

The system as described so far has significant advantages that flow from the interaction of the waveform system and the test generator. By starting with an outline waveform, it is possible to enhance the efficiency of the test-generation process greatly because the outline waveform represents high-level information that is readily available to the user but is not often employed advantageously in prior-art test-generation systems. The user typically knows the timing signals for which the circuit is designed and may know that the circuit is not intended to receive certain combinations of signals. By incorporating this information in the outline waveform, the user can prevent the test generator from generating input sequences for which the circuit to be tested was not designed.

In addition to this novel interaction of waveform system and test generator, the system of the present invention is distinguished by the "opportunistic" manner in which the test generator develops input vectors. The overall opportunistic approach to generating a sequence of input vectors differs greatly from previous methods, but it does so in such a way that it can incorporate already existing parts of some of these methods to develop each input vector. To make the salient features of the opportunistic scheme stand out in sharp relief, and to show the way in which parts of previous routines can be incorporated in the invention, I will outline a typical prior-art scheme before describing incorporation of part of it into the opportunistic strategy of the present invention.

Exemplary Existing Method

The prior-art scheme described here is used to develop tests for scan-type circuits, in which the values of the state variables—i.e., the outputs of the state components—can be set directly by switching the circuit into its shift-register mode. In such circuits, a test for a given fault can always be performed by putting the circuit into a predetermined state, applying an appropriate input vector, and observing the subsequent state to determine whether the resultant state differs from the state that a fault-free circuit would have. The prior-art scheme thus involves picking a fault, arriving at such a test for it, and then repeating the process until tests have been found for all expected faults.

A straightforward method of arriving at such a test, and one that would ultimately be successful if enough time were available, is to test each possible circuit state with all possible input vectors. For each combination of state and input vector, the defective and fault-free versions of the circuit are simulated, and success is achieved as soon as a difference is found between the resultant states of the fault-free and faulty versions.

This method of obtaining a test is much too time-consuming even for many simple circuits, however, and the prior-art test generator avoids this time-consuming process by calling on a routine called a "problem solver." A *problem solver* is a routine that acts on requests to solve one or both of two problems by, in the prior-art scheme, finding an appropriate combination of initial state and input vector. The first problem whose solution might be requested is how to *set* a particular signal line, typically the one carrying the fault, to a particular value—i.e., how to impose a signal of a given value on a particular signal line in the fault-free version of the circuit. The second problem is how to *observe* the logic level on a particular signal line—i.e., how to cause a state variable, which can be read out in a scan-type circuit, to indicate the logic level of the signal line in question. Well-known examples of problem-solver routines are the D-Algorithm and PODEM.

Rather than choosing initial states and input vectors blindly, the problem solver derives them by applying a number of rules that take into account the location of the fault and the layout of the circuit. The actual rules that the problem solver employs will not be set forth here; they are familiar to those skilled in the art. It suffices to say that the application of these rules successfully produces valid tests in most practical situations, and it does so in a very small fraction of the time that would be required if the combinations of states and input vectors were chosen blindly.

Figure 3:
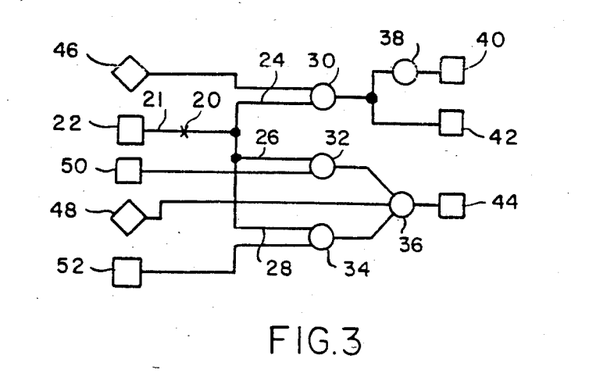
FIG. 3 is a diagram conceptually illustrating the signal paths from state components through gates to other state components in a device under test.

Although it will not be necessary to describe the rules applied by the problem solver, it will be beneficial to illustrate the two types of problems that it solves. This illustration will be carried out by reference to FIG. 3, which is a highly conceptual representation of a portion of a circuit to be tested. It will be assumed that the general direction of signal flow in FIG. 3 is from left to right. The boxes represent the state components of the circuit—i.e., the memory components such as flip-flops. The circles represent combinatorial elements without memory, such as gates. The diamonds represent input ports. The purpose of the test generator is to cause effects of a fault 20 in line 21 to give a state variable a value that differs from the value that it would have in a fault-free version of the circuit.

First, the test generator must cause a fault effect. In order to do so, it considers the nature of the fault. For instance, if the fault 20 is that the line 21 is stuck at a value of one, then no test will be successful in which the value of the state variable of component 22 is also one; both the fault-free and faulty values of line 21 would be one. Thus, the test generator determines that the value on the state component 22 should be a zero, and it presents the problem solver with the first part of its problem: the initial state and input vector must set state component 22 to zero. In a scan-type circuit, this is easy, since state components can readily be set in such a circuit.

Not only must a fault effect be generated, it must also be observed. Thus, the test generator presents the problem solver with the second part of its problem: application of the initial state and input vector must propagate this fault effect on line 21 to one of the state components. No attempt will be made here to describe how the problem solver performs its task, but a problem solver must consider that the fault effect of line 21 appears on lines 24, 26, and 28 but that it may or may not propagate through one of the subsequent gates 30, 32, 34, 36, and 38 to affect a state component such as state components 40, 42, and 44. From an inspection of the diagram of FIG. 4, it is logical to assume that the propagation of the fault effects through one or more of the gates can, in some cases, be affected by the values of the signals at input ports 46 and 48 as well as by the values of the state variables represented by state components 50 and 52. These considerations are used in choosing a likely combination of circuit state and input vector.

The fault-free version and the version with the chosen fault are then simulated with this state and input vector to determine if the combination does indeed result in detection of the fault. That is, complete simulation is still required, but the simulation typically has to be performed only on one or very few combinations of input vector and circuit state rather than, as would be the case if the combinations were chosen blindly, on an infeasibly large number of combinations. If the simulation indicates that the test for the defect in question has been successful, the operation is repeated for another of the possible defects that can occur in the circuit, and this process continues until a test has been provided for each possible defect.

At this point, two observations should be made to point up the novel features of the opportunistic approach that is about to be set forth. First, in deriving a given input vector, attention in the just-outlined method was given neither to previous input vectors nor to subsequent input vectors. This is to be expected in testing scan-type circuits because their states can be set directly. For non-scan-type circuits, on the other hand, it has typically been necessary to search for a *sequence* of input vectors because the states of such circuits cannot be set directly; derivation of an input vector was complicated by the fact that each input vector was derived as part of a search through the large number of possible sequences of input vectors. In contrast, although the method of the present invention has particular application to non-scan-type circuits, it can generate tests effectively by deriving each input vector individually—i.e., without searching among long sequences of input vectors—and it can thus employ some of the routines used in the prior-art method just outlined.

The second observation is that the method just outlined picks a particular fault that is to be propagated to a state component or output port by application of the single input vector being derived. Since the state of the circuit can be set directly, such a single input vector can always be found. In the present invention—and in previous methods employed for non-scan-type circuits—the objective is not just to propagate an effect of a fault to a state component or output port from an initial state that can be set directly; it is to propagate the effect of a fault to an output port from an initial state that cannot be directly controlled. This more stringent objective cannot in general be achieved for a particular fault by application of a single input vector. This is why the typical test-generation method for non-scan-type circuits has had to derive several input vectors concurrently.

The System of the Present Invention

However, the method of the present invention can usually generate a test efficiently for a non-scan-type circuit by deriving input vectors individually, as the above-described method for scan-type circuits does. The method of the present invention is usually successful despite its more stringent objective because, unlike the method described above, it does not pick a particular fault more or less randomly and then attempt to propagate it by application of an appropriate input vector. Instead, it considers all of the remaining faults and fault effects to find a likely one to propagate before it assigns the problem solver the task of propagating it. The method of the present invention is therefore "opportunistic"; it attempts to propagate those faults and fault effects that present the best opportunities for useful fault-effect propagation.

To find likely candidates from among many faults and their effects, the method of the present invention executes a search through a representation of the circuit containing information about all of those faults and effects simultaneously.

Figure 4A:
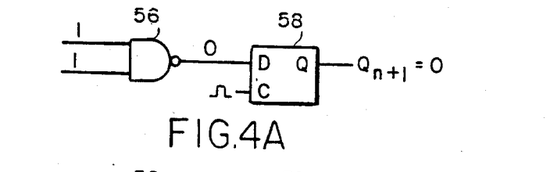
FIGS. 4A–4D illustrate a way in which the fault effects in several simulated faulty versions of the circuit can be considered simultaneously.

This concept of a signal line carrying more than one fault effect is illustrated in FIGS. 4A–4D. In FIG. 4A, a fault-free version 54 includes a NAND gate 56 and a D-type flip-flop 58. At a given time, both inputs to the NAND gate 56 are one, so its output is zero. When the flip-flop 58 is clocked, its output will become zero.

Figure 4B:
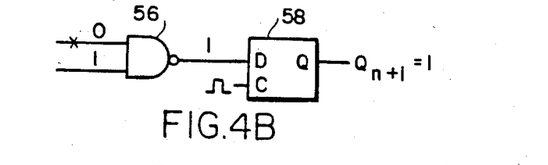

A version nearly identical to that of FIG. 4A is shown in FIG. 4B, which therefore employs the same reference numerals. The only difference is that a defect is depicted in FIG. 4B; specifically, the upper input to gate 56 is stuck at zero. As a result, the output of the NAND gate is one, and the output of the flip-flop 58 after it is clocked will be one rather than zero. The output lines of the NAND gate 56 and the flip-flop 58 therefore carry fault effects in FIG. 4B: their signals differ from those on corresponding lines in the fault-free version.

Figure 4C:
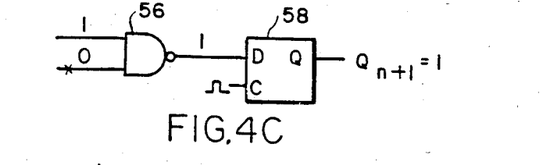

The version of FIG. 4C is similar to that of FIG. 4B, but its fault is on the other input port of the NAND gate 56. Since that input port, too, would be carrying a one in the fault-free version, the version of FIG. 4C carries fault effects, which in this case happen to be the same as those in FIG. 4B. Clearly, further faulty versions are possible. Some of the faulty versions will have some, both, or neither of the fault effects depicted in FIGS. 4B and 4C.

Figure 4D:
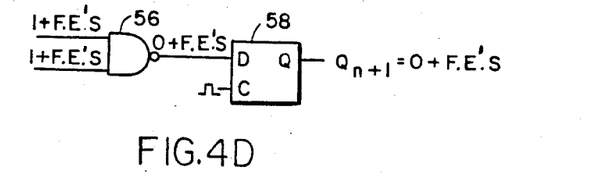

FIG. 4D illustrates the manner in which the several versions might be represented simultaneously. Specifically, the legend "0+FE's" indicates that the fault-free value of the NAND gate 56 is zero but that certain of the possible defects result in a different output. By employing this type of a representation, it is feasible to consider all of the possible defects simultaneously in determining a likely input vector for fault propagation. That is, the test generator does not have to look at each separate faulty version; it merely locates the "F.E.'s" and determines which among them presents an opportunity for propagating a fault effect. It does not need to concern itself with which faults caused the effects or how many of them there are.

Figure 5:
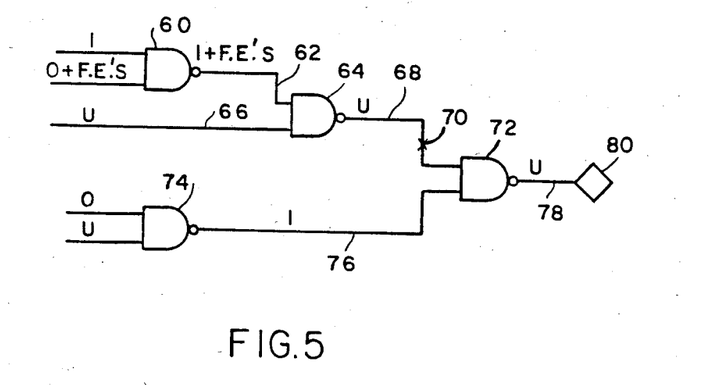
FIG. 5 is a gate-level diagram illustrating the manner in which the test generator of the present invention chooses faults and fault effects for propagation.

By employing this type of representation, the method of the present invention conducts a search of the type that will be illustrated by reference to FIG. 5. FIG. 5 depicts the simulation of the circuit in the midst of the derivation of an input vector. As was mentioned above, certain fault effects can be propagated by certain components of the input vector irrespective of what the other components are. FIG. 5 illustrates the fault simulation at a point in the simulation at which some of the components of the input vector have been assigned but some remain unassigned. The signal lines whose values depend on the values of the unassigned input-vector components are designated by the legend "U."

The signal lines marked with a "U" thus represent lines whose signals the testing device can affect by its choice of the remaining components of the input vector. Thus, there is a difference between *unassigned* signal lines and signal lines whose signals are *undetermined*. As was mentioned above, it may be possible to set the initial state of the circuit under test. However, in some cases it is not possible to set all of the components initially, and some state variables are thus undetermined. It often is not possible immediately to affect the values of these undetermined state variables. Thus, there is a difference between unassigned signal lines and undetermined signal lines. Undetermined signal lines, which the apparatus of the present invention avoids in searching for faults and fault effects that it is attempting to propagate, are not shown in FIG. 5.

In FIG. 5, a NAND gate 60 receives as one of its inputs a logical one. This input is the same regardless of which fault-free or faulty version is being considered. This input may be a one rather than a "U" because there is no way to affect that input by application of the current input vector. In the alternative, it may be that this input that can be affected by the input vector currently being derived but that the components of the input vector that affect it have already been assigned at the point in the derivation of the current input vector depicted in FIG. 5.

The other input to gate 60 is designated "0+F.E.'s." As was explained in connection with FIG. 4, this means that the value of this signal is a logical zero in the fault-free version and possibly in some faulty versions but that at least one of the faulty versions contains a fault effect at that point. Consequently, the output of gate 60, which appears on line 62, contains a fault effect in at least one of the faulty versions.

The signal on signal line 62 is one of the inputs to a second NAND gate 64, whose other input, on line 66, is unassigned, so the output of NAND gate 64 is also unassigned. That is, if the signal on line 66 is ultimately set to a logical zero, then the output of NAND gate 64 will be a zero regardless of whether signal line 62 carries fault effects or not.

Accordingly, signal line 68 carries a "U." Also depicted in signal line 68 is a fault origin 70. That is, one or more of the faulty versions contains a fault at this location. In this example, the fault is assumed to be that line 68 is stuck at a logical value of zero. No fault-effect indication is present on signal line 68, because there may as yet be no fault effect; if the signal on line 68 in the fault-free version is ultimately assigned to a logical zero, then there will be no difference between the fault-free version and the version with the stuck-at-zero fault on line 68. Hence, there will be no fault effect.

The signal on line 68 is one input to a NAND gate 72, whose other input originates in a further NAND gate 74. The inputs to NAND gate 74 are a logical zero and a "U." Although one of the inputs to the NAND gate is unassigned, its output is not, since the output of NAND gate 74 will be a logical one regardless of what value is ultimately assigned to its currently unassigned input. Thus, signal line 76 carries a logical one as the other input to NAND gate 72. The output of NAND gate 72 does depend on the value of its unassigned input, so its output on line 78 is depicted as "U." A diamond 80 indicates that the signal on line 78 is the signal present on one of the output ports; that is, it is a directly observable signal.

In order to determine which faults or fault effects to call on the problem solver to propagate, the test generator performs a so-called depth-first search, starting from output ports whose values are still unassigned. In the example, the search begins at output port 80. At each node in the depth-first search, the test generator determines whether an undetected fault origin is on the node and if that node is at "U." The first node that is encountered in the depth-first search is signal line 78. Signal line 78 does not contain an undetected fault origin. Since it does not, and since it also carries no fault effects, the search proceeds, possibly to the node representing signal line 76.

At that node, the test generator notes that the node is already assigned and carries no fault effects. It accordingly concludes that the branch of the circuit that includes signal line 76 presents no opportunities for fault-effect propagation, and it thus returns to the last node at which it could branch. That is, it starts again at signal line 78 and this time proceeds to signal line 68 rather than to signal line 76. Here again the first test is whether the line has an unassigned value and an undetected fault. In the case of signal line 68, the answer is yes, and the test generator has thus found an objective for the problem solver.

Specifically, the test generator calls on its problem solver to find a way to set signal line 68 to a logical one (since the defect is that line 68 is stuck at zero) and also to "observe" the value of the signal on line 68. In this case, the solution to the problem is to specify components of the input vector that will cause signal line 66 to carry a logical zero. The fault-free signal on line 68 will then be changed from unassigned to a value of one with a fault effect, and this fault effect will be propagated through gate 72 to the output port 80.

It should be noted that the test generator found line 68 not only to have a fault effect but also to have an unassigned value. If the fault effect had instead been on line 76, which did not have an unassigned value, then the test generator could not have employed line 76 in furnishing an objective to the problem solver; the value on that node was already assigned and so could not be affected.

It is also instructive to consider what would happen if no fault effect 70 were present on line 68. The test generator would note that the value carried on line 68 is "U," so it would proceed deeper into the depth-first search. In doing so, it might reach signal line 66, which, also having a value of "U" and no undetected faults, would permit the search to proceed further, beyond the portion of the circuit depicted in FIG. 5. On the other hand, if the branch chosen were that containing signal line 62, the test generator would find that line 62 does not carry a "U" value but does carry a fault effect. The discovery of a fault effect is the other occasion on which the test generator assigns an objective to the problem solver. In this case, the problem for the problem solver does not include setting a node to a particular value; the value carried on signal line 62 has already been assigned. The problem assigned to the problem solver is only to "observe." That is, it must assign components to the input vector being derived that will cause the fault effect to propagate to the output or, failing that, to cause the fault effect to propagate at least to another state component. In the illustrated situation, this objective is achieved by assigning components to the input vector that will cause a logical one to appear on signal line 66. Under the conditions depicted in FIG. 5, this will cause propagation of the fault effects on line 62 through gates 64 and 72 to the output port 80.

Figure 6:
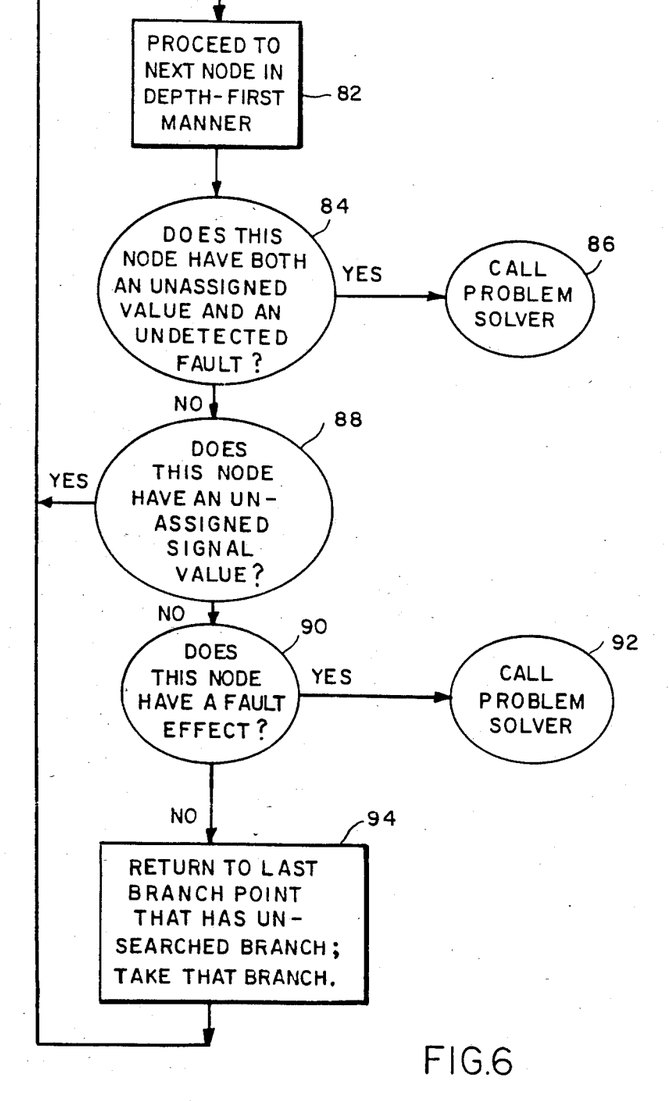
FIG. 6 is a flow chart that outlines a part of the routine for choosing those faults and effects.

A portion of this routine for finding objectives for the problem solver is depicted in the flow chart of FIG. 6. As was explained in connection with FIG. 5, the routine begins at a node with an unassigned value and proceeds from node to node in a depth-first search. Whenever it does not find an objective at a particular node, it proceeds to the next node, as is indicated in the first step 82 of the flow chart of FIG. 6. The first determination is then whether the node has an undetected fault and carries an unassigned signal. If so, the objective is found, and the problem solver is called. This is depicted at flow-chart steps 84 and 86.

If the node does not have an undetected fault, or if it does have an undetected fault but carries an assigned value, then the test generator proceeds to step 88, in which it checks to see whether the node has a fault effect. If it does, then the fault effect is on a "U boundary"; since the previous node in the depth-first search was of necessity unassigned, the fault effect can be propagated to it, and it thus is likely that the problem solver will be able to find input-vector components that will cause propagation of this fault effect to an output port or a state component. Therefore, the problem solver is called, as step 90 indicates.

If the results of the tests represented by steps 84 and 86 are both negative, the test generator proceeds to ensure that the node is unassigned, as the flow chart indicates at step 92. That is, the test generator ensures that it is still in the portion of the circuit that can be affected by assignment of further input-vector components. If it is, then it proceeds to the next node found in the depth-first search, and the steps are repeated. If the node currently being considered is not unassigned, then the search has reached that part of the circuit that cannot be affected by input-vector components, and it thus is not worth while to continue that branch of the search. Accordingly, the search returns to the last previous branch point at which an unsearched branch remains, as block 96 of FIG. 6 indicates.

In FIG. 5, for instance, when the search reached line 76, it was no longer in an unassigned area, so it was not in part of a path by which fault effects could be propagated to output port 80. Accordingly, the search returned to node 78, from which the circuit branched, and it proceeded to line 68. If line 68 had already been searched, the test generator would then have proceeded to another unassigned input port because no further branch points exist between gate 72 and output port 80. If there had been further branch points, on the other hand, these branch points would have been checked in order until one was found that had unsearched branches. The search would then have proceeded on one of those unsearched branches.

It will be remembered that the problem solver in the present invention attempts not only to find input-vector components that will cause propagation of a fault effect to an output port but also, if propagation to an output port cannot be achieved, to find input-vector components that will cause propagation of a fault effect to a state component. This is a normal operation of existing problem solvers used in designing tests for scan-type circuits, because the values of the state variables representing the state components can be observed directly. Even though the state components cannot be observed directly in a non-scan-type circuit, this objective of the problem solver is retained in the present invention. The reason is that, although propagation of the fault effect by application of the input vector currently being derived may not cause propagation of that fault effect to the output, propagation to a further state component may make it possible to propagate that fault effect to the output by applying the next input vector to be derived.

According to the method of the present invention, no determination is made during the derivation of a given input vector of whether a fault effect propagated to a state component by the current input vector will thereby become capable of propagation to an output port by subsequent input vectors. In a sense, this is left to chance. However, it has been found that the system of the present invention is quite effective for developing sequences of input vectors that cause propagation of fault effects to circuit output ports without the need for performing a search among long sequences of input vectors.

As was mentioned above, the method of the present invention is distinguished by the opportunistic scheme just described. The strictly opportunistic mode of operation is particularly efficient for generation of the initial portion of a test waveform, which is the part that is effective for most of the defects. In a typical test generation, however, there comes a point at which there is a considerable reduction in the rate at which simulated defects are dropped because they have been detected. At this point of diminishing returns, there usually are relatively few defects left, and operation of the strictly opportunistic scheme becomes less efficient. However, a modified version of the scheme can be brought into play if the user has given the system some information that he may have about the high-level organization of the circuit.

Specifically, it is true in many circuits that the user knows, because of his knowledge of the overall function of the circuit, how certain state variables can readily be set or observed. That is, even though the circuit is not a scan-type device, the user may have knowledge, based on the fact that a portion of the circuit is a counter or buffer, for instance, that some of the state variables can readily be set or observed by applying appropriate sequences of input vectors.

Although the test generator and simulator have access to the data base, which gives all the information about the connections of the circuit, this is gate-level information from which it is difficult to determine proper sequences for setting or observing state variables. Given only a gate-level knowledge of the circuit, the user, too, would be hard pressed to arrive at input-vector sequences that would result in state-variable settings or observation. However, the user usually has access to high-level information about the circuit to be tested, so he will often know how to set or observe some state variables.

When the test-generation operation reaches the point of diminishing returns mentioned above, the user may call on the system to employ the higher-level information on setting and observation sequences that he has previously provided to the test generator. When this happens, the test generator searches as before for faults or fault effects. However, the portions of the circuit labeled "U" now include not only those parts that can be affected by application of a single input vector but also those parts that are identified as readily settable by application of predetermined sequences of input vectors. Thus, fault origins are more likely to be found in the "U" area.

When a fault origin is identified, the problem solver is given, as before, the objectives of setting the signal value in the location of the fault origin and observing it. In the new mode of operation, however, the problem solver now produces, rather than components of a single input vector, a sequence of such components that is known to set the fault location to the desired value. It then solves the "observe" problem, typically by returning components of a single input vector that will cause propagation to an output port or a state component. However, if the fault effect resulting from application of the value-setting sequence happens to be in a location for which the problem solver carries a predetermined "observe" sequence, it subsequently returns the observe sequence, which will cause the fault effect to be propagated to an output port.

Similarly, if the test generator, in performing this search for fault origins and fault effects, comes upon a fault effect that is at a location for which a predetermined observe sequence exists, it can employ the predetermined sequence rather than use only components of a single input vector as it does in the strictly opportunistic portion of the routine.

It should be emphasized here that, even in this second mode of operation, in which input vectors are derived in sequences rather than individually, the operation is still much more like the strictly opportunistic method than like prior-art methods for non-scan-type circuits, in which searches through long sequences of possible input vectors were performed. In this second mode of operation, no search is made through many sequences; the sequences are predetermined. Thus, the time-consuming searches, which are disadvantages of the prior-art test-generation methods for non-scan-type circuits, are avoided.

As thus modified, the method of the present invention can operate efficiently even when the number of remaining defective versions is low or when their defects are deeply embedded.

It has been found that the system of the present invention provides great efficiency in test generation; even though the strictly opportunistic part of the method considers the inputs only one step at a time, and thus cannot actually guarantee the generation of effective tests, it has in fact been found to generate tests very efficiently in practical situations. Furthermore, when the strictly opportunistic portion of the method reaches a point of diminishing returns, the basic approach used in the strictly opportunistic portion of the method is readily adapted to supplementation by user-generated information about the higher-level organization of the system.

I claim

1. A method of testing a non-scan-type digital circuit, the digital circuit having output ports, being adapted to receive input vectors, and being arranged to produce outputs at its output ports in response to application of the input vectors, the method comprising the steps of:
   A. simulating (i) a fault-free version of the digital circuit having stored state so that its output at a given time depends not only on its input at that time but also on its input of previous times and being of the non-scan type so that its state is not directly observable and (ii) faulty versions of the digital circuit having predetermined faults;
   B. deriving an input-sensor sequence, at least some of whose input vectors remain to be determined prior to derivation, to produce an input waveform whose application to any of the simulated faulty versions will result in outputs that differ from the outputs that result when that waveform is applied to the fault-free version, by choosing each input vector in at least a group of successive input vectors so as to cause propagation of a fault or fault effect chosen from among all the faults that have not been propagated to an output port by previous vectors in the waveform and from among all the fault effects that have resulted from those faults after application of all the previous input vectors in the waveform, the choice of fault or fault effect being made without regard to which faults or fault effects were propagated by previous input vectors in the waveform, the derivation of each unpredetermined input vector in the group being performed by using knowledge of the states of the simulated faulty versions that result from application of all the input vectors preceding that input vector in the waveform but without using knowledge of the actual values of previous or subsequent input vectors in the waveform;
   C. applying the input vectors of the derived waveform to the digitial circuit; and
   D. observing the resulting outputs of the digital circuit to determine whether the digital circuit has any of the predetermined faults.

2. A method as defined in claim 1 wherein the choice of the fault or fault effect to be propagated is made by searching for a node
   (i) for which the signals on an entire path from that node through an output port of the digital circuit depend, in the simulated fault-free version, on the input vector currently being derived and
   (ii) on which there is a fault effect or a fault that can be made to propagate by application of the input vector currently being derived.

* * * * *